United States Patent
Shen et al.

(10) Patent No.: US 9,602,111 B1
(45) Date of Patent: Mar. 21, 2017

(54) DELAY LOCKED LOOP (DLL) LOCKED TO A PROGRAMMABLE PHASE

(71) Applicant: SK hynix memory solutions inc., San Jose, CA (US)

(72) Inventors: Chun-Ju Shen, Santa Clara, CA (US); Jenn-Gang Chern, Redwood City, CA (US)

(73) Assignee: SK hynix memory solutions Inc., San Jose, CA (US)

( * ) Notice: Subject to any disclaimer, the term of this patent is extended or adjusted under 35 U.S.C. 154(b) by 0 days.

(21) Appl. No.: 14/841,267

(22) Filed: Aug. 31, 2015

Related U.S. Application Data (60) Provisional application No. 62/054,892, filed on Sep. 24, 2014.

(51) Int. Cl.
*H03L 7/08* (2006.01)
*H03L 7/081* (2006.01)
*H03L 7/02* (2006.01)
*H03K 19/21* (2006.01)

(52) U.S. Cl.
CPC .......... *H03L 7/0814* (2013.01); *H03K 19/21* (2013.01); *H03L 7/02* (2013.01)

(58) Field of Classification Search
CPC ... H03L 7/0812; H03L 7/0814; H03L 7/0816; H03L 7/08; H03L 7/18; H03L 7/087; H03K 5/135; H03K 5/15; H03K 5/1536; H03K 3/01; H03K 3/0315; H03K 5/134; H03K 5/153; H03K 7/08
USPC ......................................... 327/156, 158, 161
See application file for complete search history.

(56) References Cited

U.S. PATENT DOCUMENTS

2011/0018601 A1* 1/2011 Yoshizawa ............ H03L 7/0812
327/158

* cited by examiner

*Primary Examiner* — John Poos
(74) *Attorney, Agent, or Firm* — IP & T Group LLP (57) ABSTRACT

An asynchronous digital logic is used to provide a pulse. A pulse train is filtered to determine an analog measurement based at least in part on the duty cycle of the pulse. The analog measurement is compared with a tunable reference associated with a programmable locked delay for the DLL. A digital code is sequenced based at least in part on the comparison. A digitally controlled delay line is programmed based at least in part on the digital code.

19 Claims, 7 Drawing Sheets

DELAY LOCKED LOOP (DLL) LOCKED TO A PROGRAMMABLE PHASE

CROSS REFERENCE TO OTHER APPLICATIONS

This application claims priority to U.S. Provisional Patent Application No. 62/054,892 entitled DELAY LOCKED LOOP (DLL) LOCKED TO A PROGRAMMABLE PHASE filed Sep. 24, 2014 which is incorporated herein by reference for all purposes.

BACKGROUND OF THE INVENTION

In high speed synchronous integrated circuits such as memory interfaces, delay locked loops (DLLs) are used to align the clock edge and eliminate the clock skew. In double data rate ("DDR") systems, DLLs are used to delay strobes by a fraction of a cycle delay, for example 90 degrees for a quarter cycle delay. A traditional way to perform this is to use a master DLL to lock a master delay line to one cycle delay. For the example of 90 degrees, the master delay line is used to configure a slave delay line to a quarter cycle delay by enabling ¼ of the delay cells, so the master delay line uses four times the area and power of the slave delay line. There is a need to be more efficient in terms of area and power for a DLL.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

An example of a 90 degree delay is DDR data sampling. To sample data, the DDR data strobe needs to be delayed by 90 degrees, or a quarter cycle delay. As described above, the traditional way is to use a master DLL to lock the master delay line to one cycle delay. The resultant locked condition, via digital code, control voltage or control current, determined by the DLL is used to configure the slave delay line to a quarter cycle delay by enabling ¼ of delay cells. Thus, to create 90 degrees in the slave delay line, conventionally a master delay line is needed which uses four times the delay cells, which results in four times the area and power consumed.

Digital Controlled Delay Lines Vs Analog Delay Lines.

In applications like DDR, the digital delay line, or more generally without limitation the "digital controlled delay line", is preferred for at least three reasons.

First, the slave delay lines should be put in the optimal locations of the IO rings of a chip to favor timing, and usually are far away from the global DLL. Long routing wires are needed to distribute the control message from the global DLL to each slave delay line. The routing cost for analog control voltage or analog control current is much higher than that for the digital control bus, due to noise and IR drop.

Second, depending on how a delay line is designed, many types of digital delay lines can work in the low voltage and share the same supply with the digital core. This makes the tasks of top level integration and power integrity easier. By contrast, many topologies for analog delay lines need the supply voltage higher than the core supply to work properly. With modern technology, core voltage trends below one volt, where many analog delay line structures cannot be utilized.

Third, the delay of digital delay lines is controlled by a digital code. If the chip environment is steady, after the DLL is locked, digital registers can be used to remember the code and disable the DLL to save power. By contrast, if analog delay lines are used, the conventional DLL may need to be enabled all the time to maintain the analog control voltage or analog control current.

Therefore, in many applications for example DDR, designers prefer the digital controlled delay line over an analog delay line.

Programmable Phase/Digital Controlled Delay Line DLL.

A DLL that uses digital controlled delay lines that can lock to a programmable phase between 0 and 180 degrees is disclosed. A DLL wherein a master delay line has the same number of delay cells as a slave delay line is disclosed.

With the disclosed DLL locking technique, a master delay line uses the same number of delay cells as a slave delay line} does, providing for example a replica of each other, so and thus there is no waste with regards to area consumption and/or power consumption.

Unlike the traditional design in which there may be extra wires or buffers to integrate four slave delay lines to build a master delay line, the disclosed technique details the master delay line and slave delay line are nearly an identical replica of each other, improving timing match between the two. This allows the disclosed DLL to be used for more applications than with traditional DLL systems.

As discussed above, there are many benefits of using digital delay lines in applications like DDR systems. In specific cases, analog delay lines are required due to certain specifications, applications, or design constraints. The disclosed DLL still can support an analog delay line by adding a digital-to-analog converter ("DAC"). In such way, an "analog controlled" analog delay line is simply converted to a "digital controlled" (analog) delay line, and equalize the two scenarios. Thus, the benefits discussed above for the digitally controlled delay lines still remain for these analog lines.

Traditional Design.

Figure 1:
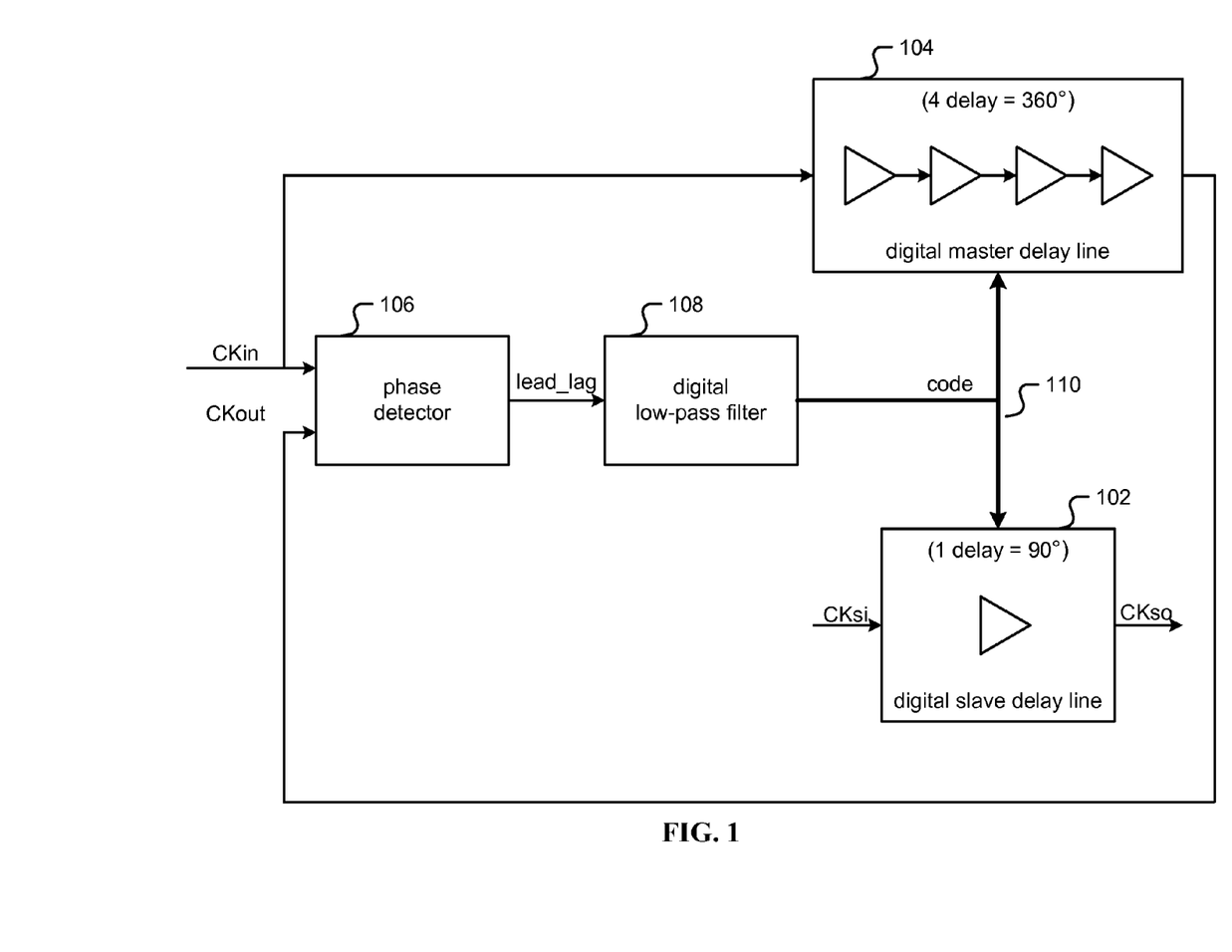
FIG. 1 is a block diagram illustrating an example of a traditional DLL.

FIG. 1 is a block diagram illustrating an example of a traditional DLL. The traditional digital DLL locks output clock CKout to the input reference clock CKin with one clock cycle delay, or 360 degree phase difference, in between. This traditional DLL may be implemented without limitation in any semiconductor device and with any design flow. For example, an ASIC design flow may include a digital flow to synthesize circuits from the hardware description language, compared to the analog flow using custom transistor level or gate level design. For the example shown in FIG. 1, the slave delay line (102) generates a quarter cycle delay, or 90 degrees, which is suitable for a DDR application. Thus, the master delay lines (104) contain 4 replicas of slave delay lines: when the DLL is locked to 360 degrees, the master delay line (104) has a 360 degree delay, while the slave delay line (102) has a 90 degree delay.

The phase detector or "PD" (106) is typically based on the flip flop, which senses the edges of CKin and CKout, and reports a digital signal "lead lag" to show which clock edge leads the other. A digital low pass filter or "LPF" (108) then filters out the jitter noise from the signal "lead lag", and sends out a robust "code" (110) to control how many delay cells are enabled in the digital delay lines. When the FIG. 1 DLL is locked, "lead lag" dithers between logic 1 and logic 0, and "code" dithers between two nearby codes. If the noise is too high to be filtered out by the LPF, "code" may dither in a wider range.

The digital LPF (108) depicted is a general digital state machine. In many instances, the digital state machine (108) needs to do the 180 degree edge detection, lock detection, and/or provide other features other than simply low pass filtering. These additional features increase complexity for digital state machine (108). This increases digital logic and decrease efficiency for the design.

Disclosed DLL.

Figure 2:
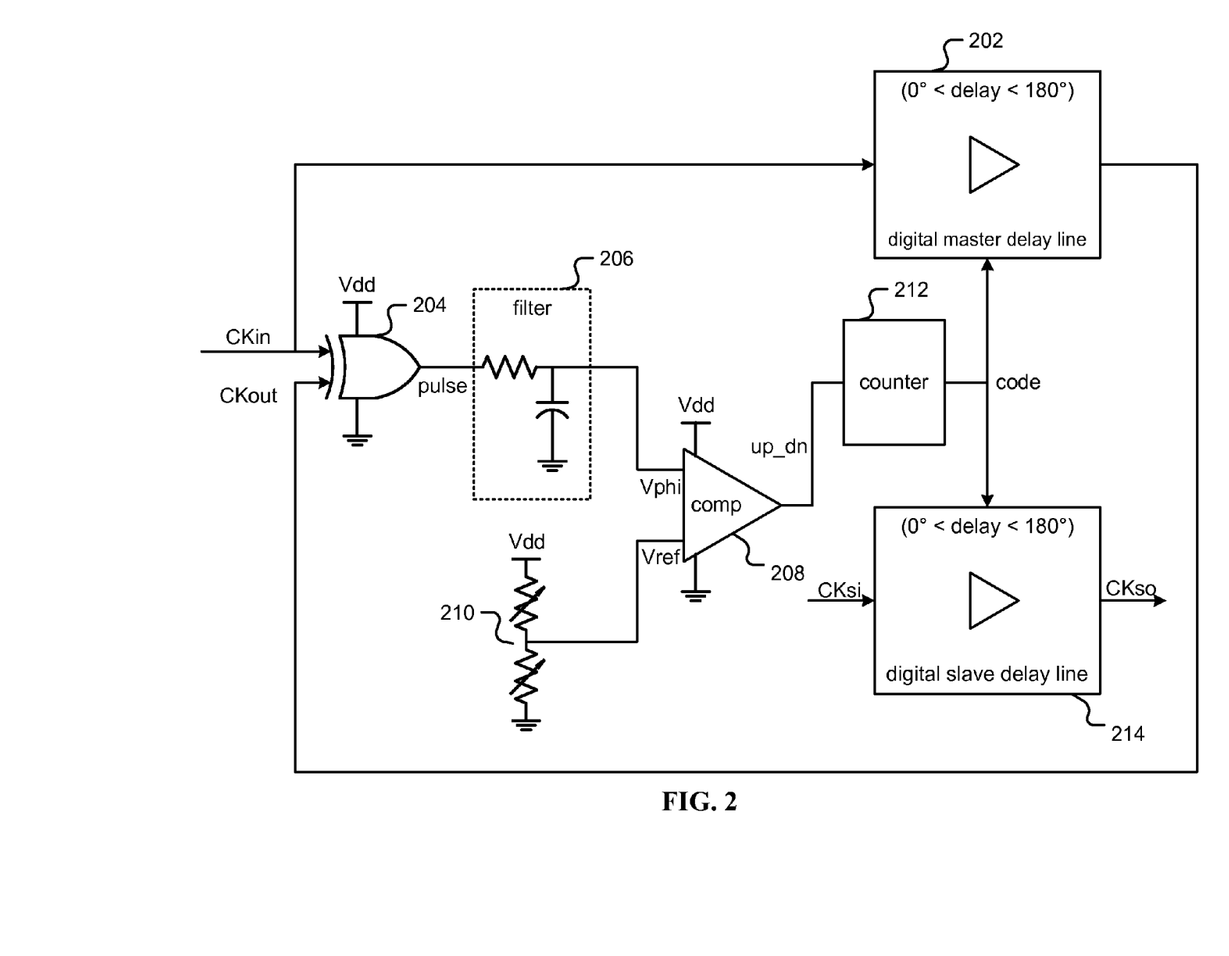
FIG. 2 is a block diagram illustrating an embodiment of a system for a DLL with a programmable locked phase.

FIG. 2 is a block diagram illustrating an embodiment of a system for a DLL with a programmable locked phase. Without loss of generality and without limitation many different analog designs may be used for each of the blocks shown in FIG. 2, and the ones depicted are simply examples.

In one embodiment, the reference clock CKin is coupled both to a digital master delay line (202) and to an asynchronous digital logic (204) as an analog form of a phase detector. In the embodiment shown, a simple exclusive OR (XOR) gate is used for asynchronous digital logic (204). XOR gate (204) takes input from CKin and from the output of the digital master delay line (202), CKout.

In one embodiment, the XOR gate (204) thus exclusive ORs the two clock signals CKin and CKout, and generates a signal "pulse" with two times as many pulses as either clock. The duty cycle of "pulse" may be linearly proportional to the phase difference between CKin and CKout.

In one embodiment, an analog filter (206) filters "pulse" over time. In the example shown, a simple first-order passive low pass filter (206) is used to convert "pulse" into a DC voltage Vphi. For example, if the phase difference between CKin and CKout is 90 degrees, the duty cycle of "pulse" is 50% and Vphi=Vdd/2. Ideally, if the phase difference decreases to 0, the duty cycle of "pulse" decreases to 0, and Vphi decreases to 0 as well. On the other hand, if the phase difference increases to 180 degrees, the duty cycle of "pulse" increases to 100%, and Vphi increases to the supply voltage Vdd. Therefore, in the ideal case, the XOR gate (204) combined with the LPF (206) provides the ability to translate any phase difference between 0 and 180 degrees to a DC voltage between 0 and Vdd.

In one embodiment, an analog comparator (208) compares Vphi with the reference voltage Vref, which is generated by a voltage divider (210) whose division ratio is programmed by a resistor ladder. Based on which value is larger, the (208) comparator's output "up_dn" is either logic 1 or logic 0, and this "up_dn" signal will trigger a synchronous digital logic (212), for example an up/down counter (212) to count up or count down. Note that the up/down counter (212) is operating at a sub-sampling rate. That means the up/down counter (212) internally uses a divided-down clock. The divided-down ratio depends on the loop settling time, which in this example is determined by the pole of LPF (206) in the first order sense. The counting value stored in the up/down counter (212) is then decoded to a digital "code", which digitally controls how much delay is across the master delay line.

In one embodiment, when the loop is locked, Vphi is equal or nearly equal to Vref, due to quantization error limited by the step size of the digital delay line, the "up_dn" signal dithers between logic 1 and logic 0, and "code" dithers between two nearby codes. The delay across the master delay line is locked to (Vref/Vdd)×180 degrees. Since Vref is programmable, the phase the DLL may be locked to is also programmable. A slave delay line (214) is instantiated as a replica or near-replica of the master delay line (202), and the slave delay line (214) is controlled by the same "code", such that the delay across the slave delay line (214) is the same as the delay across the master delay line (202). Note that Vref can also be used as a knob/adjustment to shift the (214) slave delay line's delay slightly away from the original target. Such an adjustment may be useful for skew compensation in applications like DDR I/O.

In one embodiment, for practical implementation when the phase difference is too close to 0 degree or 180 degrees, asynchronous logic/the XOR gate (204) may not respond fast enough to generate a valid pulse. Also, if Vref is set to 0 or Vdd, the comparator may not be able to maintain its high DC gain because its differential pair could go into the triode region, for example. Such real issues seldom require the slave delay line (214) to provide a delay near 0 or 180 degrees, so the academic issue described due to transistors' limitation rarely arises.

To compare with FIG. 1, a conventional DLL with the digital delay line usually requires a PD (106) based on flip flops to send out digital bits to the digital filter (108). Nominally, the digital filter (108) may become a complex state machine that is prone to bugs. A mixed mode system with both Register Transfer Level ("RTL") and/or digital blocks and analog components is usually not simulation-friendly, and makes it harder to identify the bugs during the design and simulation phases. By comparison with FIG. 2, the filter (108) is at design-time migrated from the digital domain to the analog domain, and the analog filter (206) required by this system is instead a simple passive device. The rest of digital components, including the synchronous logic (212) are also simple, in that that may be implemented by either simple RTL design or custom gate level design. By using an analog comparator (208), the DLL is still able to convert phase information from the analog domain to the digital domain, so the digital (controlled) delay line can still be used in the disclosed system.

Digital (controlled) slave delay lines (214) are highly desirable for applications like DDR because the slave delay lines may be positioned at optimal locations across I/O rings. Many times slave delay lines are far away from the global DLL on a given chip's floorplan. If digital slave delay lines are used, it may be easier to distribute the digital code through a bus from the global DLL to each slave delay line.

By contrast, if analog delay lines are chosen, it may be more difficult and costly to distribute the analog control voltage or analog control current from the global DLL to the analog slave delay lines. In such case, a chip designer may need to add more DLLs to the chip's floorplan so that every analog slave delay line is associated with a nearby DLL In addition, many digital delay line designs do not require a high supply voltage and can be put into the same power domain as the digital core, making top level integration much easier. Also in addition, after a DLL is locked, the code sent to digital slave delay lines (214) can be stored in a digital register, and creates a possibility to disable the DLL to reduce or eliminate power consumption while using the code stored in the register.

Extension of Disclosed DLL.

Figure 3:
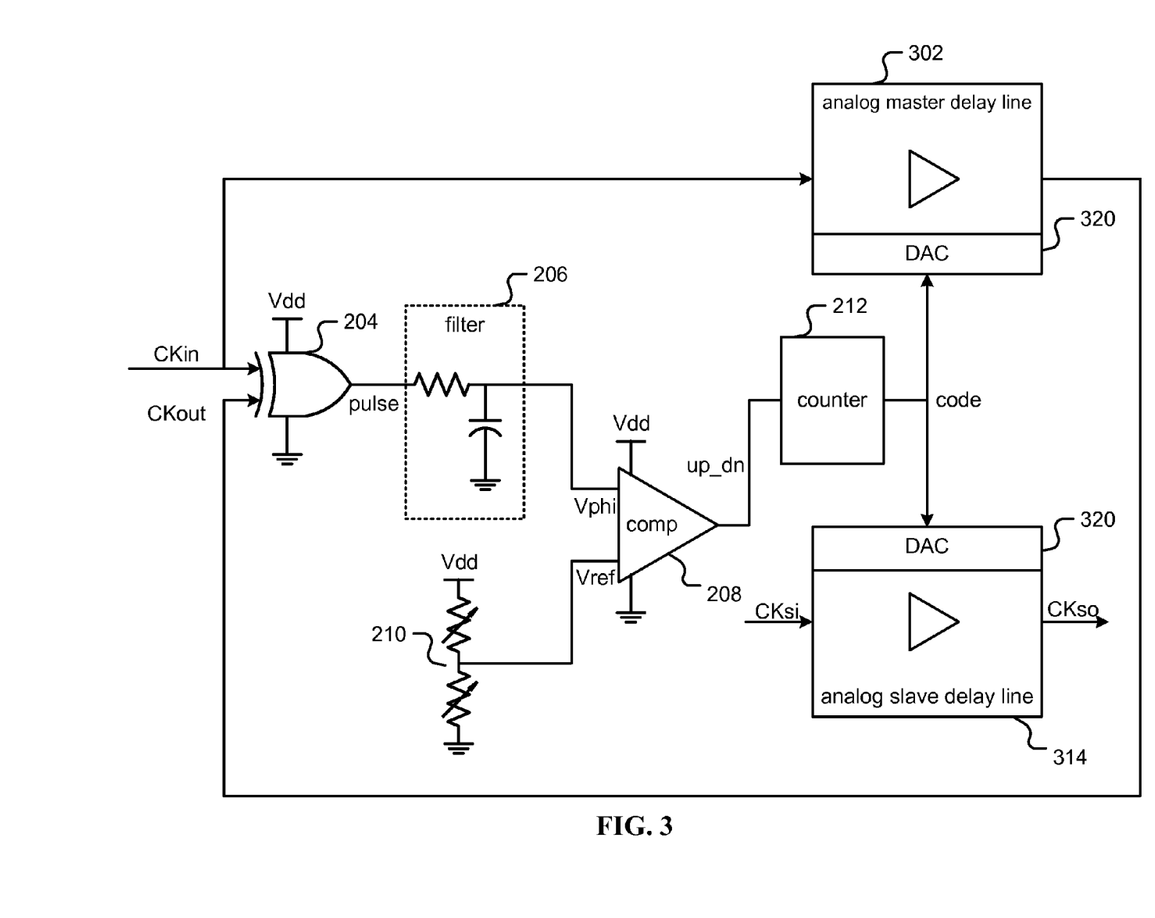
FIG. 3 is a block diagram illustrating an embodiment for an extension of a system for a DLL with a programmable locked phase.

FIG. 3 is a block diagram illustrating an embodiment for an extension of a system for a DLL with a programmable locked phase. The digital delay lines discussed above, in general, may be referred to any "digitally controlled" delay line. That is, the delay is controlled by the digital code.

In the above discussion, it was assumed that the delay is controlled by the number of enabled delay cells. However, the delay can also be controlled by other properties such as capacitance, resistance, voltage, and current. For example, there may be a capacitor array inserted into the buffer stages, and a delay is adjusted based on how many capacitors are enabled. Furthermore, although there are the aforementioned benefits of using pure digital delay lines, the disclosed architecture may be extended to the case where analog delay lines are required. FIG. 3 provides an example of how the disclosed DLL works with analog delay lines.

In comparison to FIG. 2, the majority of the loop is identical but digital delay lines (202) (214) are replaced with analog delay lines (302) (314). Digital-to-analog converters (DACs) (320) are also added to convert the digital "code" from synchronous logic (212) to an analog control message such as voltage and current. By adjusting either the analog control voltage or analog control current, the delay of the analog delay lines (302) (314) may be changed. There are many different ways to design the DACs (320), but one factor is to use the same and well-matched DACs (320) for both the master delay line (302) and slave delay line(s) (314).

Figure 4A:
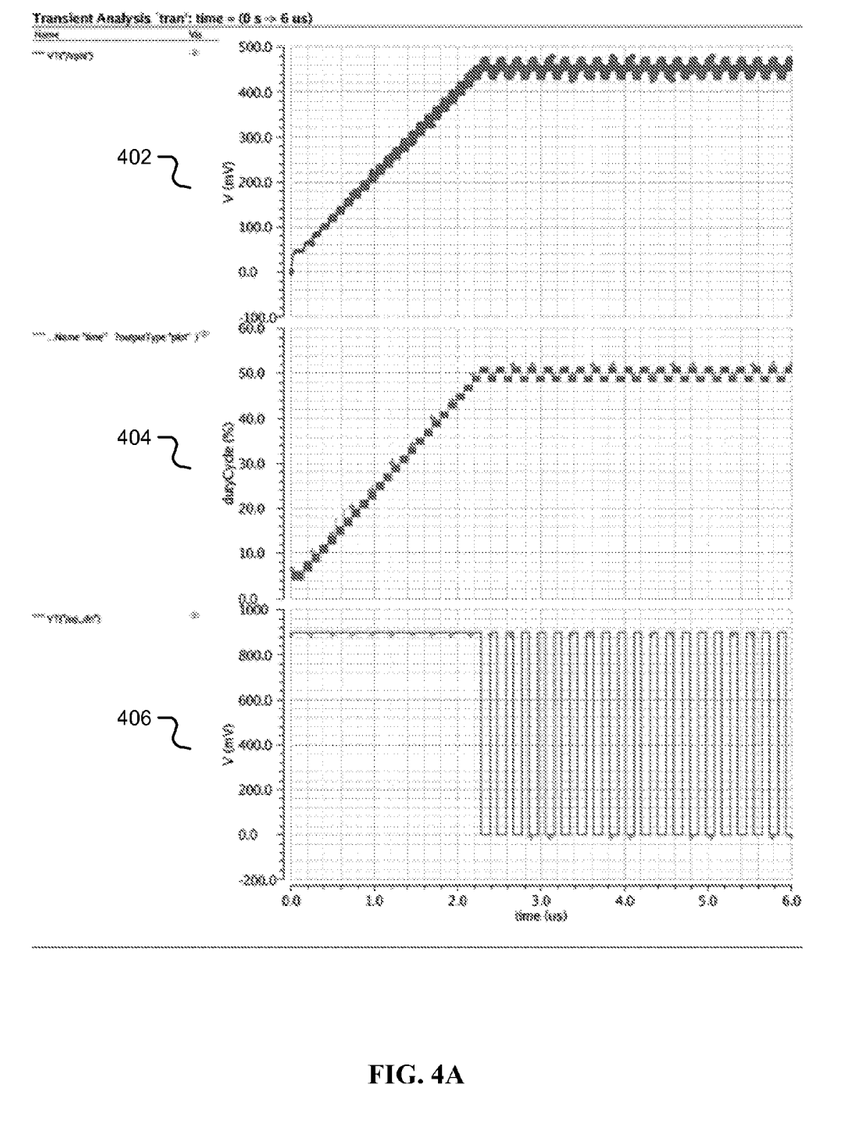
FIGS. 4A, 4B, and 4C are simulated waveforms illustrating locking behavior of a DLL with a programmable locked phase.
Figure 4B:
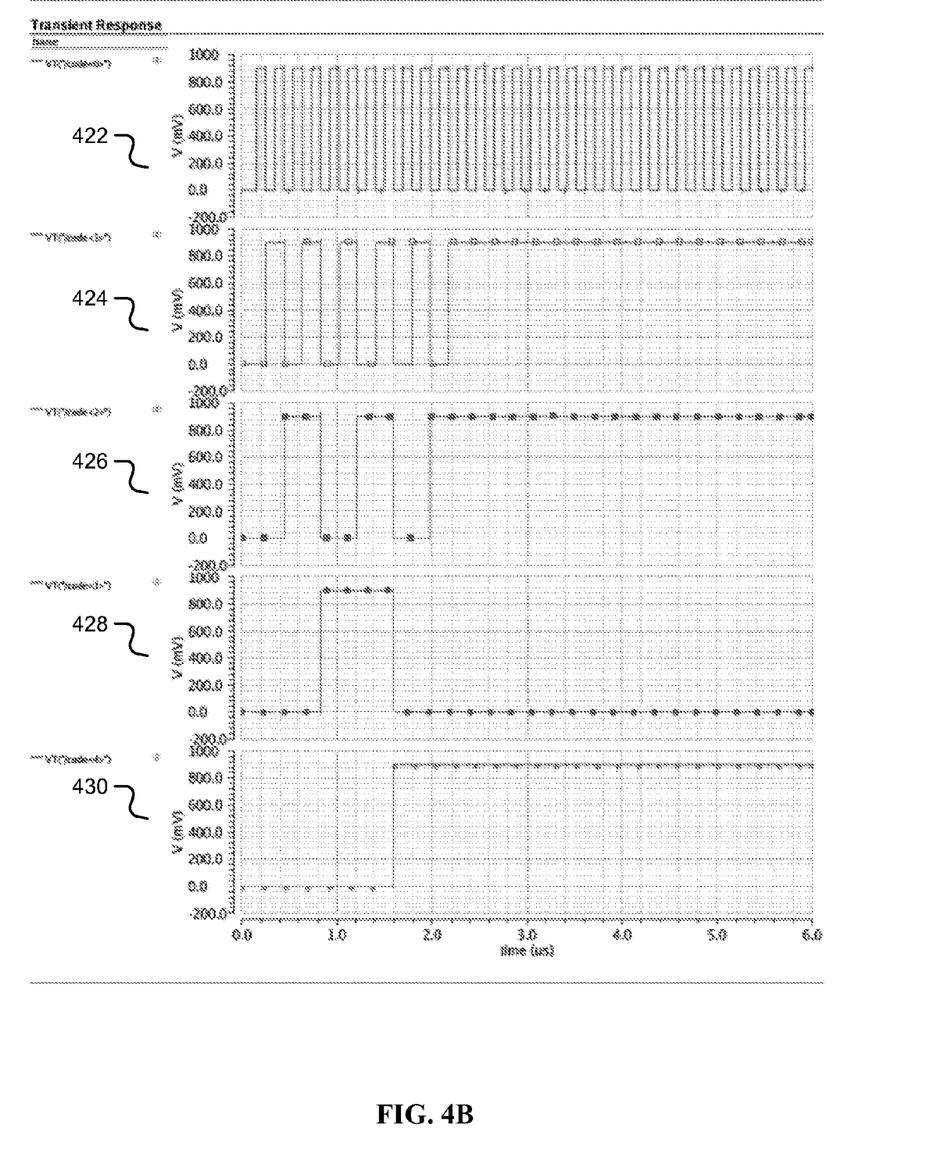
Figure 4C:
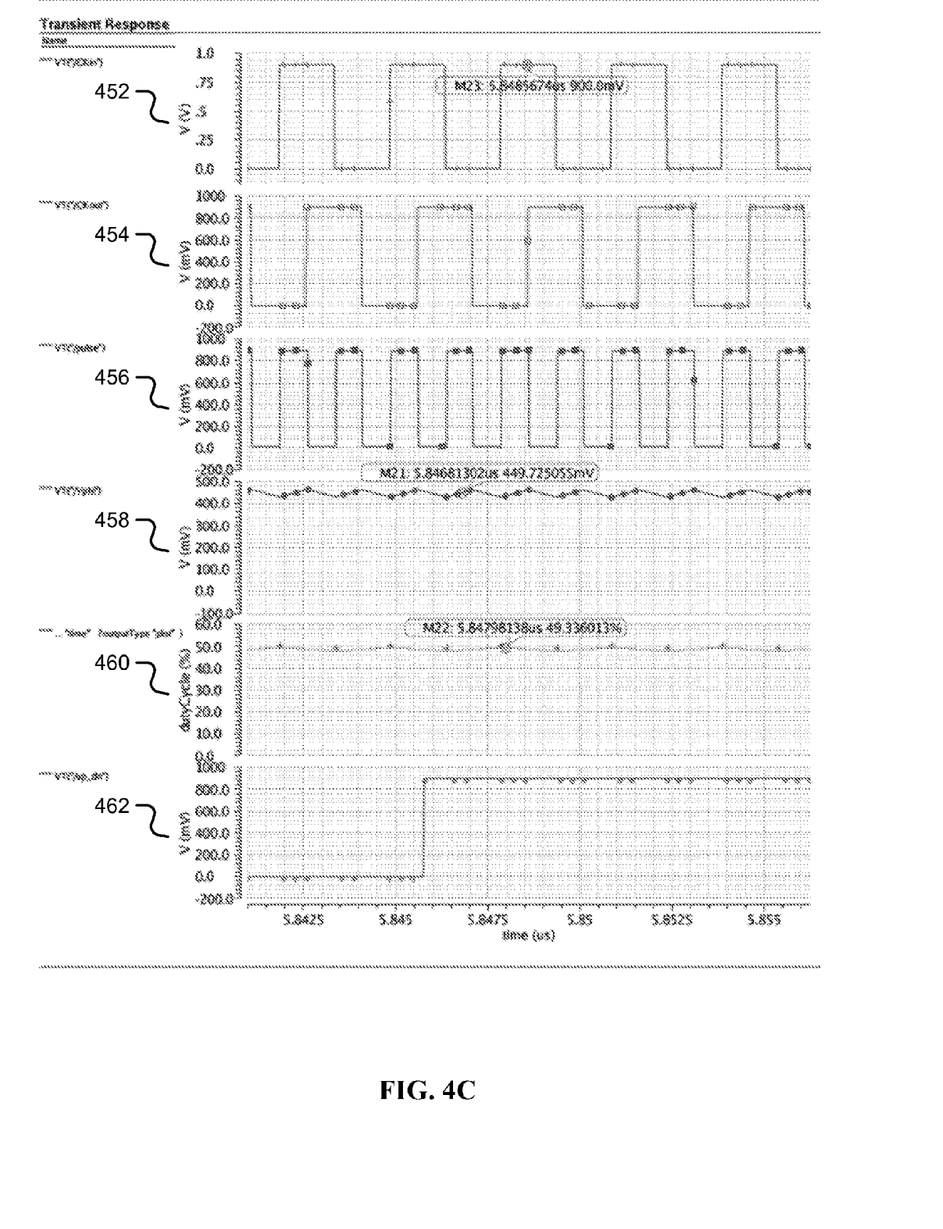

FIGS. 4A, 4B, and 4C are simulated waveforms illustrating locking behavior of a DLL with a programmable locked phase. In the example shown in the FIGS. 4A through 4C, Vref is set to Vdd/2 (=900 mV/2=450 mV) and the delay of the master delay line is expected to be 90 degrees once the DLL is locked.

In FIG. 4A, the first waveform (402) represents Vphi in mV over the initial six microseconds, and the second waveform (404) shows the duty cycle of the pulse signal in % over the same period, and the third waveform (406) shows the up_dn signal in mV over the same period. In FIG. 4B, the five waveforms (422), (424), (426), (428), and (430) represent the five bits of the code signal in mV over the same six microseconds, from least-significant bit to most-significant bit, respectively.

In FIG. 4C, the waveforms are shown 'zoomed in' well within the last microsecond long after lock. First waveform (452) is the CKin signal in V, second waveform (454) is the CKout signal in V, third waveform (456) is the pulse signal in mV, fourth waveform (458) is the Vphi signal in mV, fifth waveform (460) shows the duty cycle of the pulse signal in %, and sixth waveform (462) is the up_dn signal in mV.

Initially, as can been seen in FIG. 4B, the DLL code starts from 0, where all five bits are 0. Thus, initially, the master delay line (202) has the minimum delay. Because the delay between CKin and CKout is minimal, the pulse width of the logic (204) output, the pulse signal, is shortest, and the duty cycle of the pulse signal is smallest as well as shown with waveform (404). Thus, initially the DC voltage Vphi is much lower than Vdd/2, and the comparator (208) will set its output "up_dn" to logic 1 as shown in waveform (406).

When receiving a logic 1, the up/down counter (212) will begin counting up, and the result is that the DLL "code" is increased as shown in waveforms (422)-(430), along with the delay across the master delay line. As long as Vphi is smaller than Vref, the up/down counter (212) will keep counting up at a sub-sampling rate and create more delay across the master delay line (202). Eventually, Vphi approaches Vref around 2.3 microseconds, and the loop is locked.

When the loop is locked, Vphi is close to a half Vdd (i.e. 450 mV), and the duty cycle of the pulse signal is around 50%. The comparator (208) outputs a dithered up_dn signal, and the (212) up/down counter's output code also dithers between two nearby codes, 10110 and 10111. As seen in FIG. 4C, when the zoomed-in waveform is in the locked condition, it can be observed CKout lags CKin by about 90 degrees, the target.

Figure 5:
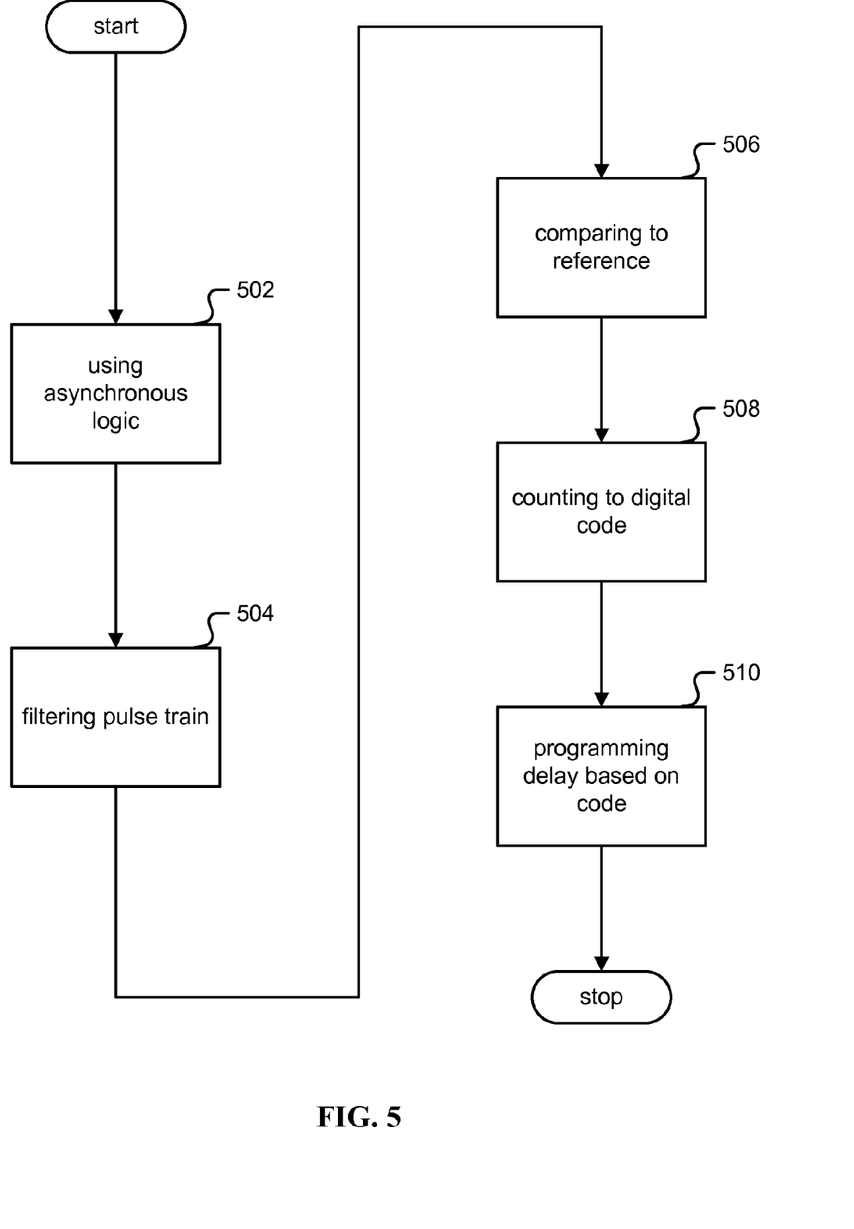
FIG. 5 is a block diagram illustrating an embodiment of a system for a digital delay locked loop.

FIG. 5 is a block diagram illustrating an embodiment of a system for a digital delay locked loop. In one embodiment the technique of FIG. 5 is performed by the apparatus in FIGS. 2 and/or 3.

In step 502, asynchronous logic, for example XOR gate (204), is used to provide a pulse.

In step 504, a pulse train is filtered, for example with filter (206), to determine an analog measurement based at least in part on the duty cycle of the pulse.

In step 506, the analog measurement is compared, for example with comparator (208), with a tunable reference, for example voltage divider (210), associated with a programmable locked delay for the DLL.

In step 508, a digital code is sequenced to, for example with counter (212), based at least in part on the comparison.

In step 510, a digital delay line (202) (214) and/or digitally controlled delay line (302) (314) is programmed based at least in part on the digital code.

In one embodiment a common digital power supply, for example Vdd in FIGS. 2 and/or 3, provides common supply voltage for one or more of the following: asynchronous digital logic (204), filter (206), analog comparator (208), and synchronous digital logic (212). In one embodiment, asynchronous digital logic (204) is an XOR logic, operates at or above twice the reference clock, and/or is coupled to a reference clock and output of the digital delay line and/or digitally controlled delay line.

In one embodiment, the programmable locked delay for the DLL may be set between 0 and 180 degrees. In one embodiment, the digitally controlled delay line comprises an analog delay line (302) (314) coupled with a DAC (320). In one embodiment, the digitally controlled delay line and/or digital delay line is a master delay line and the DLL also includes a slave delay line associated and/or coupled with the master delay line. In one embodiment, the master delay line uses the same number of delay cells as the slave line, and/or is a replica of the slave delay line.

In one embodiment, the filter (206) is a passive low-pass filter and/or a passive first-order low-pass filter. In one embodiment, the tunable reference (210) is based at least in part on a register DAC. In one embodiment, the synchronous digital logic (212) is an up/down counter, coupled to the digital delay line and/or digitally controlled delay line by a digital code, clocked at a sub-sampling rate, clocked at a sub-sampling rate based at least in part on a filter/loop settling time, and/or configured to receive a power-saving register value with the DLL is powered-down.

Summary.

The disclosed DLL uses a master delay line that requires only ¼ of the area and power when compared to conventional designs. A lower area results in lower costs for a chip, and lower power lowers operating costs and improves operating tolerances. By simple adjusting the Vref, a wide range of delay programmability may be achieved. Vref may also be used as a knob for skew compensation in applications like DDR.

The simple analog filter (206) eliminates the need to develop a complex digital state machine (106) (108), while still makes it possible to use the digital delay line (202) (214). A digital slave delay line (214) is highly desirable for example applications like DDR as described above.

In addition, a mixed-mode circuit combining RTL and/or digital blocks and analog blocks may not be simulation-friendly and error prone without a solid simulation foundation. The disclosed method reduces the complexity of the RTL and/or digital block without increasing cost and complexity for its analog components, enabling easier simulation and/or verification flow.

The digital delay line enables a possibility to disable the DLL after the DLL is locked, such that the code is remembered by digital registers. This further reduces power consumption for a chip. The disclosed concept easily supports analog delay lines by adding DAC (320). As the mechanism of the DAC is independent of the DLL, after the DLL is locked and the code is stored into the digital registers, the DLL can still be disabled to save the power.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A system for a digital delay locked loop ("DLL"), comprising:
   an asynchronous digital logic;
   an analog filter coupled to an output of the asynchronous digital logic;
   an analog comparator coupled to: (1) an output of the analog low pass filter; and (2) a tunable reference associated with a programmable locked delay for the DLL;
   a synchronous digital logic coupled to an output of the analog comparator; and
   a digitally controlled delay line coupled to an output of the synchronous digital logic, wherein the asynchronous digital logic is coupled to a reference clock and an output of the digitally controlled delay line.

2. The system as recited in claim 1, further comprising a common digital power supply providing common supply voltage for the:
   asynchronous digital logic; and
   analog comparator.

3. The system as recited in claim 2, wherein the common digital power supply further provides common supply voltage for the synchronous digital logic.

4. The system as recited in claim 1, wherein the asynchronous digital logic is an exclusive OR ("XOR") logic.

5. The system as recited in claim 4, wherein the XOR logic operates above twice the reference clock.

6. The system as recited in claim 1, wherein the programmable locked delay for the DLL may be set between 0 and 180 degrees.

7. The system as recited in claim 1, wherein the digitally controlled delay line comprises an analog delay line coupled with a digital-to-analog converter (DAC).

8. The system as recited in claim 1, wherein the digitally controlled delay line is a master delay line, and the DLL further comprises a slave delay line coupled with the master delay line.

9. The system as recited in claim 8, wherein the master delay line uses a same number of delay cells as the slave delay line.

10. The system as recited in claim 8, wherein the master delay line is a replica of the slave delay line.

11. The system as recited in claim 8, wherein the slave delay line is a significant distance from a global DLL on a chip floorplan.

12. The system as recited in claim 1, wherein the analog filter is a passive low-pass filter.

13. The system as recited in claim 12, wherein the passive low-pass filter is a passive first-order low-pass filter.

14. The system as recited in claim 1, wherein the tunable reference is based at least in part by a register DAC.

15. The system as recited in claim 1, wherein the synchronous digital logic is an up/down counter.

16. The system as recited in claim 15, wherein the up/down counter is coupled to the digitally controlled delay line by a digital code.

17. The system as recited in claim 1, wherein the synchronous digital logic is clocked at a sub-sampling rate based at least in part on a loop settling time.

18. The system as recited in claim 1, wherein the synchronous digital logic is further configured to receive a power-saving register value when the DLL is powered-down.

19. A method for a DLL, comprising:
   using an asynchronous digital logic to provide a pulse;
   filtering the pulse train to determine an analog measurement based at least in part on the duty cycle of the pulse;
   comparing the analog measurement with a tunable reference associated with a programmable locked delay for the DLL;

sequencing to a digital code based at least in part on the comparison; and programming a digitally controlled delay line based at least in part on the digital code, wherein the asynchronous digital logic is coupled to a reference clock and an output of the digitally controlled delay line.

* * * * *